(12) United States Patent
Wada et al.

(10) Patent No.: US 6,882,297 B2
(45) Date of Patent: Apr. 19, 2005

(54) ANALOG-TO-DIGITAL CONVERSION CIRCUIT AND IMAGE PROCESSING CIRCUIT FOR STEPWISE CONVERSION OF A SIGNAL THROUGH MULTIPLE STAGES OF CONVERSION UNITS

(75) Inventors: Atsushi Wada, Ogaki (JP); Kuniyuki Tani, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/808,566

(22) Filed: Mar. 25, 2004

(65) Prior Publication Data

US 2004/0189507 A1 Sep. 30, 2004

(30) Foreign Application Priority Data

Mar. 26, 2003 (JP) .......................................... 2003-085314
Mar. 3, 2004 (JP) .......................................... 2004-058546

(51) Int. Cl.[7] .............................................. H03M 1/38
(52) U.S. Cl. ........................................ 341/161; 341/155
(58) Field of Search ................................. 341/118, 120, 341/144, 155, 156, 161

(56) References Cited

U.S. PATENT DOCUMENTS

| 5,966,088 | A | * | 10/1999 | Matsumoto et al. | ........ 341/156 |
| 6,169,502 | B1 | * | 1/2001 | Johnson et al. | ............. 341/120 |
| 6,359,579 | B1 | * | 3/2002 | Chiang | ........................ 341/155 |
| 6,396,429 | B1 | * | 5/2002 | Singer et al. | ................ 341/155 |
| 6,456,223 | B1 | * | 9/2002 | Yu et al. | ...................... 341/161 |
| 6,486,820 | B1 | * | 11/2002 | Allworth et al. | ............. 341/161 |
| 6,710,735 | B1 | * | 3/2004 | Lin | ............................. 341/161 |

FOREIGN PATENT DOCUMENTS

JP          9-69776          3/1997

* cited by examiner

*Primary Examiner*—Michael Tokar
*Assistant Examiner*—Linh V Nguyen
(74) *Attorney, Agent, or Firm*—McDermott Will & Emery LLP

(57) ABSTRACT

A multi-stage pipelined AD converter has n stages of conversion units, such as a first conversion unit, a second conversion unit, an (n−1)th conversion unit, and an nth conversion unit, which successively convert an analog signal into a digital signal each by several bits starting from the most significant bit. Each of the converted digital signals of several bits is combined in a digital output circuit. A first voltage source supplies a higher voltage than a second voltage source. The first voltage source supplies a high voltage to the first stage or the first conversion unit, while the second voltage source supplies a low voltage to the second and subsequent stages of the second conversion unit to the nth conversion unit which require a lower analog accuracy.

18 Claims, 6 Drawing Sheets

ANALOG-TO-DIGITAL CONVERSION CIRCUIT AND IMAGE PROCESSING CIRCUIT FOR STEPWISE CONVERSION OF A SIGNAL THROUGH MULTIPLE STAGES OF CONVERSION UNITS

BACKGROUND OF THE INVENTION

1. Field of the Invention

The present invention relates to an analog-to-digital conversion circuit, and more particularly to a technique for reducing power consumption in the analog-to-digital conversion circuit.

2. Description of the Related Art

Recently, cellular phones have been provided with various additional functions such as an image shooting function, an image reproducing function, a moving image shooting function, and a moving image reproducing function. Accordingly, there are increasing needs for an analog-to-digital converter (hereinafter referred to as an "AD converter") incorporated into the cellular phone to operate at lower voltages with lower power consumption. In particular, one-chip LSIs incorporating an AD converter has employed finer design rules year by year, and thus required lower supply voltages. As an AD converter having high conversion accuracy, known to those skilled in the art is a multi-stage pipelined AD converter (for example, see Japanese Patent Laid-Open Publication No. Hei 9-69776, its entirety and FIG. 1).

Reducing the overall voltage range for an analog signal to realize lower power consumption would readily cause degradation in conversion accuracy clue to decreases in S/N ratio. In general, the pipelined AC converter incorporates a sampling circuit with capacitors, and its mean square voltage of thermal noises is expressed by the following equation:

$$\overline{v^2} \propto kT/C \qquad \text{Equation 1}$$

Assuming that the amount of thermal noise is constant as expressed by Equation 1, a reduction in voltage range for an analog signal would cause a corresponding decrease in S/N ratio. For example, an overall accuracy of 10 bits would require an S/N ratio of about 60 dB or more. To compensate the aforementioned S/N ratio when the voltage range is reduced, it is found from Equation 1 that C has to be increased to thereby reduce the thermal noise. For example, halving the voltage range for an analog signal would make it necessary to increase C by four times to compensate for the halving. This causes an increase in size of the capacitor leading to an increase in circuit area. On the other hand, uncompensated noises themselves would cause degradation in characteristics.

SUMMARY OF THE INVENTION

The present invention has beer, achieved in view of the foregoing circumstances. It is therefore an object of the present invention to provide an AD converter which operates with lower power consumption. It is another object of the invention to provide an AD converter which operates with lower power consumption while avoiding an increase in circuit area and deterioration in characteristics. It is still another object of the invention to provide an AD converter which employs a simple structure to provide improved characteristics.

One of the aspects of the present invention is an analog-to-digital conversion circuit. This circuit comprises a group of conversion units including at least two stages of conversion units each of which produces a digital value of several bits in stages according to an input analog voltage, and a plurality of power sources which supply voltages to the group of conversion units. In the group of conversion units, a first stage converts a predetermined number of bits from the most significant bit, and second and subsequent stages convert lower-order bits than the predetermined number of bits. The plurality of power sources supply voltages to the conversion units in the second and subsequent stages, the voltages being lower than the voltage supplied to the conversion unit in the first stage.

In the group of conversion units, the conversion unit in the first stage requires the highest: resolution (S/N), whereas the second and subsequent stages require gradually reduced resolutions. Thus, according to this aspect, a high voltage is supplied only to the first stage while lower voltages are supplied to the second and subsequent stages, thereby reducing the overall voltage. As used herein, the expression "the second and subsequent stages" does not necessarily mean that three or more stages of conversion units are included, but also refers to only the second stage in a group of two stages of conversion units.

Another aspect of the present invention is also an analog-to-digital conversion circuit:. This circuit has a group of conversion units including at least two stages of conversion units each of which produces a digital value of several bits in stages according to an input analog voltage, and a power source which supplies a voltage to the group of conversion units. In the group of conversion units, a first stage converts a predetermined number of bits from the most significant bit, and second and subsequent stages convert lower-order bits than the predetermined number of bits. In the group of conversion units, a voltage supplied to a stage by the power source is lower than that supplied to its preceding stage.

As described above, in the group of conversion units, the second and subsequent stages need gradually lowered resolutions. Accordingly, this aspect of the invention allows a voltage supplied to a stage to be lower than that supplied to its preceding stage in the first to the subsequent stages, thereby reducing the overall voltage.

Still another aspect of the present invention is also an analog-to-digital conversion circuit. This circuit has a group of conversion units including at least two stages of conversion units each of which produces a digital value of several bits in stages according to an input analog voltage, a power source which supplies a voltage to the group of conversion units, and a voltage step-up unit which steps up the voltage. In the group of conversion units, a first stage converts a predetermined number of bits from the most significant bit, and second and subsequent stages convert lower-order bits than the predetermined number of bits. The step-up unit steps up the voltage to be supplied from the power source to at least part of the conversion unit in the first stage into a higher voltage.

As described above, in the group of conversion units, the second and subsequent stages need gradually lowered resolutions. Accordingly, this aspect of the invention allows a lower voltage to be supplied to other than the first stage while allowing a stepped-up higher voltage to be supplied only to the first stage, thereby reducing the overall voltage while maintaining the resolution of the first stage.

In the group of conversion units, a conversion unit to which the power source supplies a lower voltage may be designed to have a lower voltage range for an analog signal. That is, the voltage range is set corresponding to the voltage supplied to each stage, thereby reducing the overall voltage.

It is to be understood that any combinations of the foregoing components, and the components and expressions of the present invention having their methods, apparatuses, systems, and the like replaced mutually are also intended to constitute applicable aspects of the present invention.

DETAILED DESCRIPTION OF THE INVENTION (First Embodiment)

Figure 1:
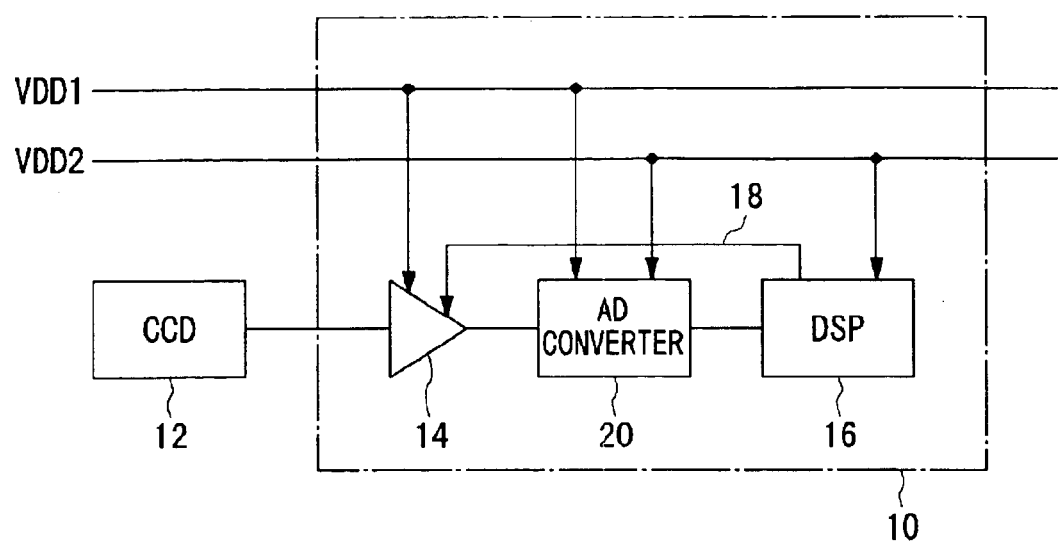
FIG. 1 is a diagram showing the basic configuration of an image processing circuit.

FIG. 1 shows the basic configuration of an image processing circuit. An image sensor 12 such as CCD (Charge Coupled Device) and a CMOS sensor receives light from a subject to convert the light into an electric signal, which is then supplied to a one-chip LSI (Large Scale Integration) 10. The one-chip LSI 10 incorporates an AGC (Auto Gain Control) 14, an AD converter 20, and a DSP (Digital Signal Processor) 16. The AGC 14 amplifies the electric signal received from the image sensor 12, and the AD converter 20 converts the amplified analog signal into a digital signal, on which the DSP 16 performs compression or other image processing. Part of the output from the DSP 16 is fed back to the AGC 14 via a feedback circuit 18.

The one-chip LSI 10 is supplied with power from two sources, i.e., a first voltage source VDD1 and a second voltage source VDD2. The first voltage source VDD1 supplies 2.7V and the second voltage source VDD2 supplies 1.2V. Thus, the AGC 14 is supplied with a voltage of 2.7V from the first voltage source VDD1 while the DSP 16 is supplied with a voltage of 1.2V from the second voltage source VDD2. Conventionally, the AD converter 20 is supplied only with a voltage of 2.7V from the first voltage source VDD1. However, in this embodiment, the AD converter 20 is supplied with 2.7V and 1.2V from the first and second voltage sources VDD1 and VDD2, respectively.

As described later, the AD converter 20 operates at a lower voltage with lower power consumption. Accordingly, the one-chip LSI 10 and the image sensor 12 can be well incorporated into a portable terminal such as a cellular phone which is highly required to operate at lower voltages. Furthermore, the AD converter 20 will not cause an increase in circuit area due to an increase in capacitance of a capacitor, thus being well incorporated into the one-chip LSI 10.

Figure 2:
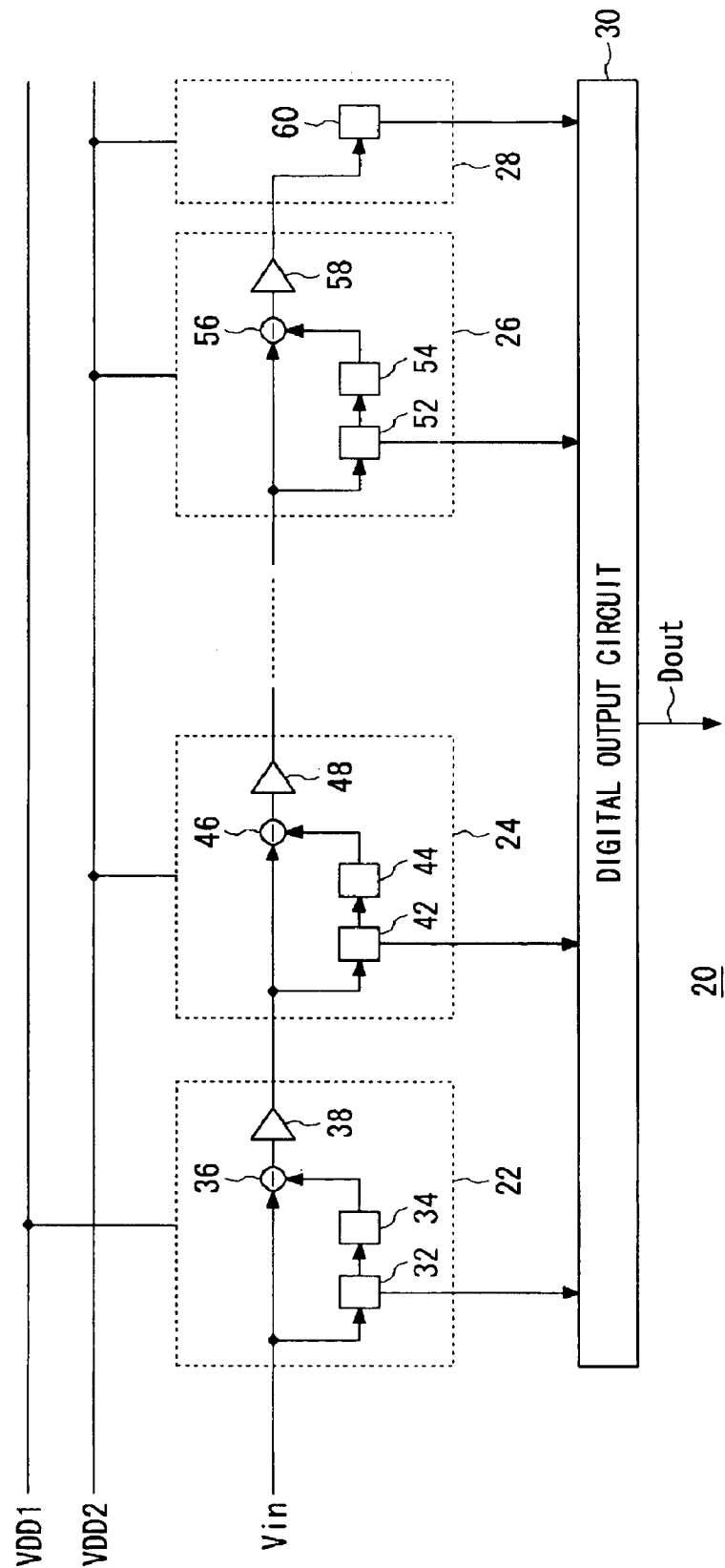
FIG. 2 is a diagram showing the configuration of an AD converter according to a first embodiment of the present invention.

FIG. 2 illustrates the configuration of the AD converter 20 according to the first embodiment. The AD converter 20 includes n stages of conversion units, i.e., the first conversion unit 22 to the nth conversion unit 28, to perform 10-bit AD conversion in stages. The first stage or the first conversion unit 22 processes four bits, and the second and subsequent stages process the remaining bits. For n=4, the second to the fourth stages may each process two bits. The first stage or the first conversion unit 22 requires an accuracy of 10 bits, whereas the second stage or the second conversion unit 24 requires an accuracy of only 10−4+1=7 bits. As such, bit accuracies required are different between the first stage and the second and subsequent stages, with different analog accuracies required, thereby resulting in voltage values essentially required being different between the first stage and the second and subsequent stages.

The first conversion unit 22 includes a first AD conversion circuit 32, a first DA conversion circuit 34, a first subtractor circuit 36, and a first amplifier circuit 38. The first AD conversion circuit 32 is a sub-AD conversion circuit which converts an input analog signal into a digital signal of a predetermined number of bits from the most significant bit. For example, in this embodiment, a digital value of four bits is delivered to the first DA conversion circuit 34 and a digital output circuit 30. The first DA conversion circuit 34 converts the digital value delivered from the first AD conversion circuit 32 into an analog signal. The first subtractor circuit 36 supplies the difference between the original input analog signal and the analog signal from the first DA conversion circuit 34 to the first amplifier circuit 38, which then amplifies the difference to output the resulting signal to the second conversion unit 24. The first subtractor circuit 36 and the first amplifier circuit 38 may be combined to form a differential amplifier circuit.

The second conversion unit 24 includes a second AD conversion circuit 42, a second DA conversion circuit 44, a second subtractor circuit 46, and a second amplifier circuit 48. Each of these components operates in the same manner as the first AD conversion circuit 32, the first DA conversion circuit 34, the first subtractor circuit 36, and the first amplifier circuit 38 of the first conversion unit 22, respectively. However, for example, the second AD conversion circuit 42 outputs two lower-order bits than the output bits from the first AD conversion circuit 32.

An (n−1)th conversion unit 26 includes an (n−1)th AD conversion circuit 52, an (n−1)th DA conversion circuit 54, an (n−1)th subtractor circuit 56, and an (n−1)th amplifier circuit 58. Each of these components also operates in the same manner as the first AD conversion circuit 32, the first DA conversion circuit 34, the first subtractor circuit 36, and the first amplifier circuit 38 of the first conversion unit 22, respectively. However, the (n−1)th AD conversion circuit 52 outputs two lower-order bits than the output bits from the preceding stage. The nth conversion unit 28 includes an nth AD conversion circuit 60. The nth AD conversion circuit 60 outputs the two bits or the least and second least significant bits. The digital output circuit 30 combines digital signals received from the first conversion unit 22, the second conversion unit 24, the (n−1)th conversion unit 26, and the nth conversion unit 28 to output a 10-bit digital signal.

In this embodiment, the first stage or the first conversion unit 22 needs the highest analog accuracy, and is thus supplied with a voltage of 2.7V from the first voltage source VDD1. Each of the conversion units in the second and subsequent stages or the second conversion unit 24 to the nth conversion unit 28 needs a less analog accuracy than the first conversion unit 22, and is thus supplied with a voltage of 1.2V from the second voltage source VDD2. This serves to reduce the overall power consumption when compared with a conventional case in which a voltage of about 2.7V is generally supplied. In particular, since the second voltage source VDD2 is originally provided to supply a low voltage to the DSP 16 of FIG. 1 and not additionally provided to implement the AD converter 20 of this embodiment, no demerit is found in the entire system.

The voltage supplied to the second and subsequent stages is lower than that supplied to the first stage. The voltage range for an analog signal in the conversion units of the second and subsequent stages is accordingly reduced to a lower voltage value. Conventionally, for example, the numbers of bits were assigned as 4, 2, 2, and 2 to be processed in the first and the subsequent stages, with the first stage being set at a corresponding voltage full-scale range of 1Vpp (peak to peak voltage) and the second stage at a voltage range of 0.5Vpp. This resulted from the numbers of bits that were assigned to maximize the processing speed of the overall AD converter. In this embodiment, the voltage supplied to the second and subsequent stages is lower than that to the first stage, and the voltage range of the second and subsequent stages is reduced correspondingly. This allows, for example, the voltage range of the second and subsequent stages to be reduced to a voltage of 0.25Vpp in peak value.

(Second Embodiment)

Figure 3:
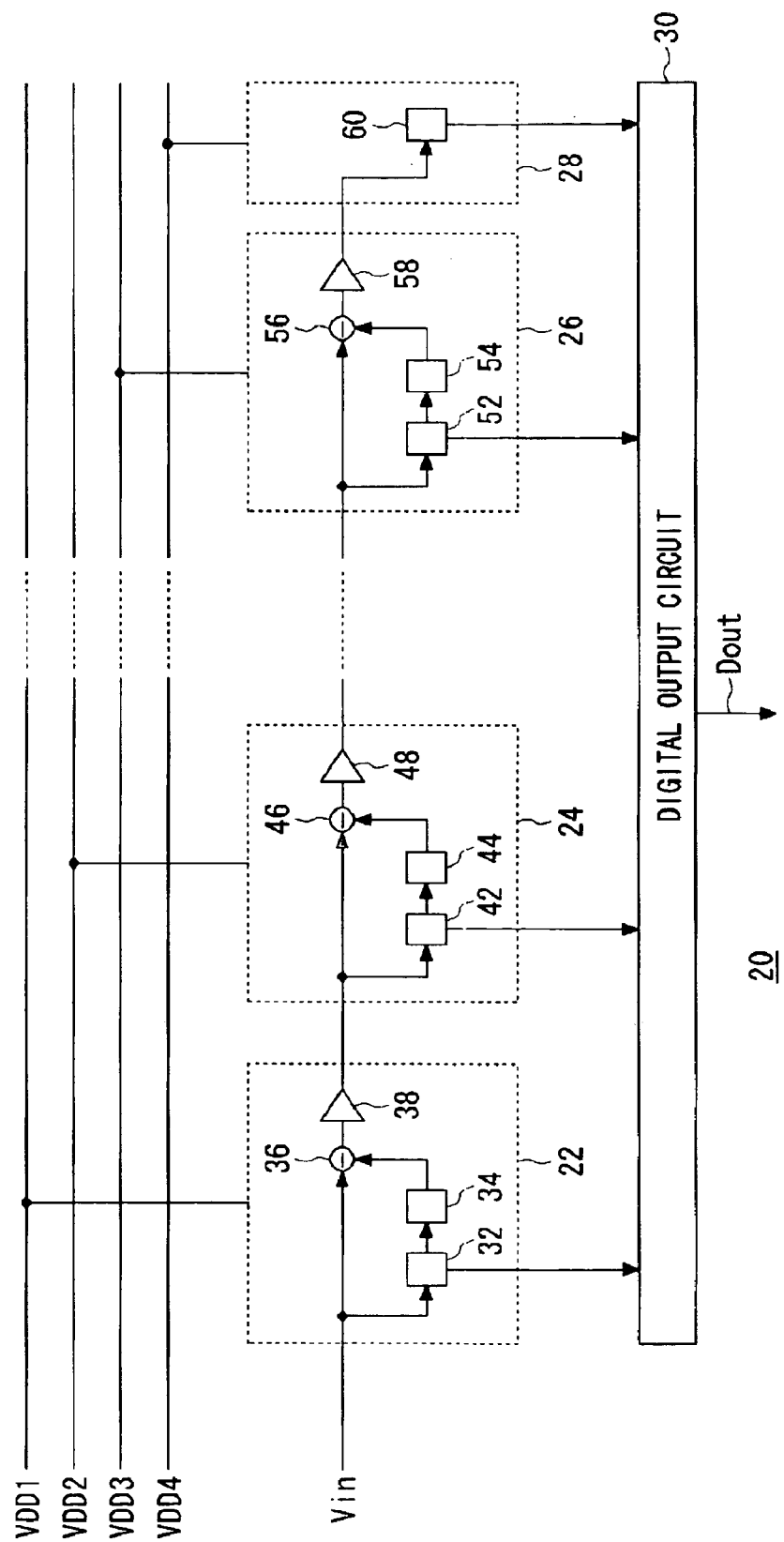
FIG. 3 is a diagram showing the configuration of an AD converter according to a second embodiment.

FIG. 3 shows the configuration of an AD converter 20 according to a second embodiment. The AD converter 20 according to this embodiment is different from that of the first embodiment in that voltages to be supplied to each of multiple stages of conversion units are gradually lowered. Now, the different point will be mainly described below.

The first conversion unit 22 and the second conversion unit 24 are supplied with a voltage from the first voltage source VDD1 and a voltage from the second voltage source VDD2, respectively. On the other hand, the (n−1)th conversion unit 26 and the nth conversion unit 28 are supplied with a voltage from a third voltage source VDD3 and a voltage from a fourth voltage source VDD4, respectively. The first voltage source VDD1 supplies the highest voltage, while the second voltage source VDD2 supplies the second highest voltage, the third voltage source VDD3 the third highest voltage, and the fourth voltage source VDD4 the fourth highest voltage. In this manner, the respective voltages supplied to each of the n stages of pipelined AD converters are successively lowered in n stages, thereby reducing the overall power consumption. Furthermore, the voltage ranges for an analog signal in each stage are successively reduced corresponding to the respective voltages supplied to each stage separately in n stages.

(Third Embodiment)

Figure 4:
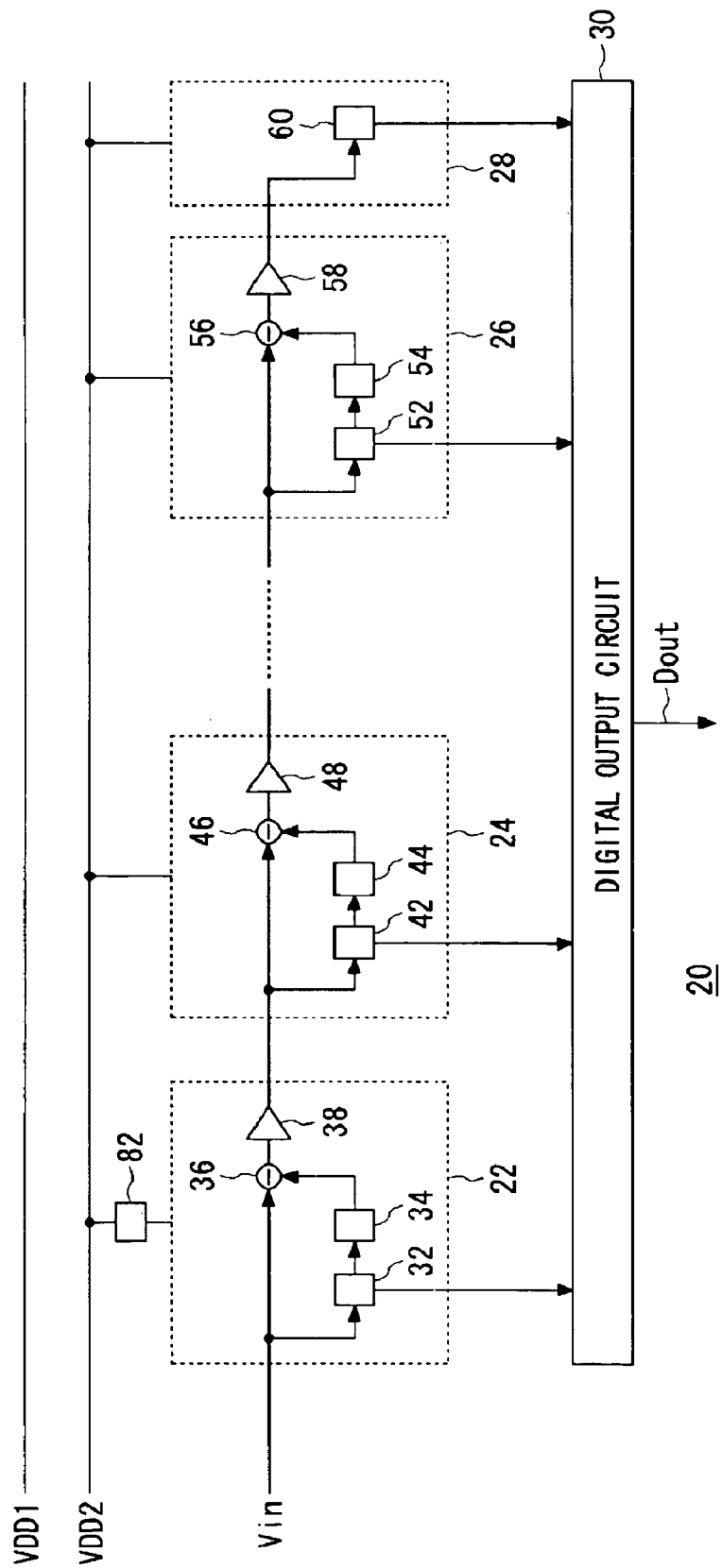
FIG. 4 is a diagram showing the configuration of an AD converter according to a third embodiment.

FIG. 4 shows the configuration of an AD converter 20 according to a third embodiment. The AD converter 20 according to this embodiment is different from that of the first and second embodiments in that the second voltage source VDD2 supplies a voltage to all of multiple stages of conversion units. Now, the different point will be mainly described below.

The AD converter 20 has a voltage step-up unit 82 for stepping up the voltage supplied. The step-up unit 82 steps up the voltage, supplied by the second voltage source VDD2 to the first conversion unit 22, from 1.2V to 2.7V. For example, the step-up unit 82 includes a charge pumping DC-DC converter. In this manner, a higher voltage is supplied only to the first stage or the first conversion unit 22, while a lower voltage is supplied to the second and subsequent stages or the second conversion unit 24 to the nth conversion unit 28, thereby reducing the overall voltage. Correspondingly, as in the first embodiment, the voltage range for an analog signal of the second and subsequent stages or the second conversion unit 24 to the nth conversion unit 28 is lowered with respect to that of the first stage or the first conversion unit 22. On the other hand, the step-up unit 82 may not only step up a voltage supplied to the entire first conversion unit 22 but also step up only a voltage supplied to a component included in the first conversion unit 22. For example, the step-up unit 82 may step up a voltage supplied to the first amplifier circuit 38 included in the first conversion unit 22.

(Fourth Embodiment)

Figure 5:
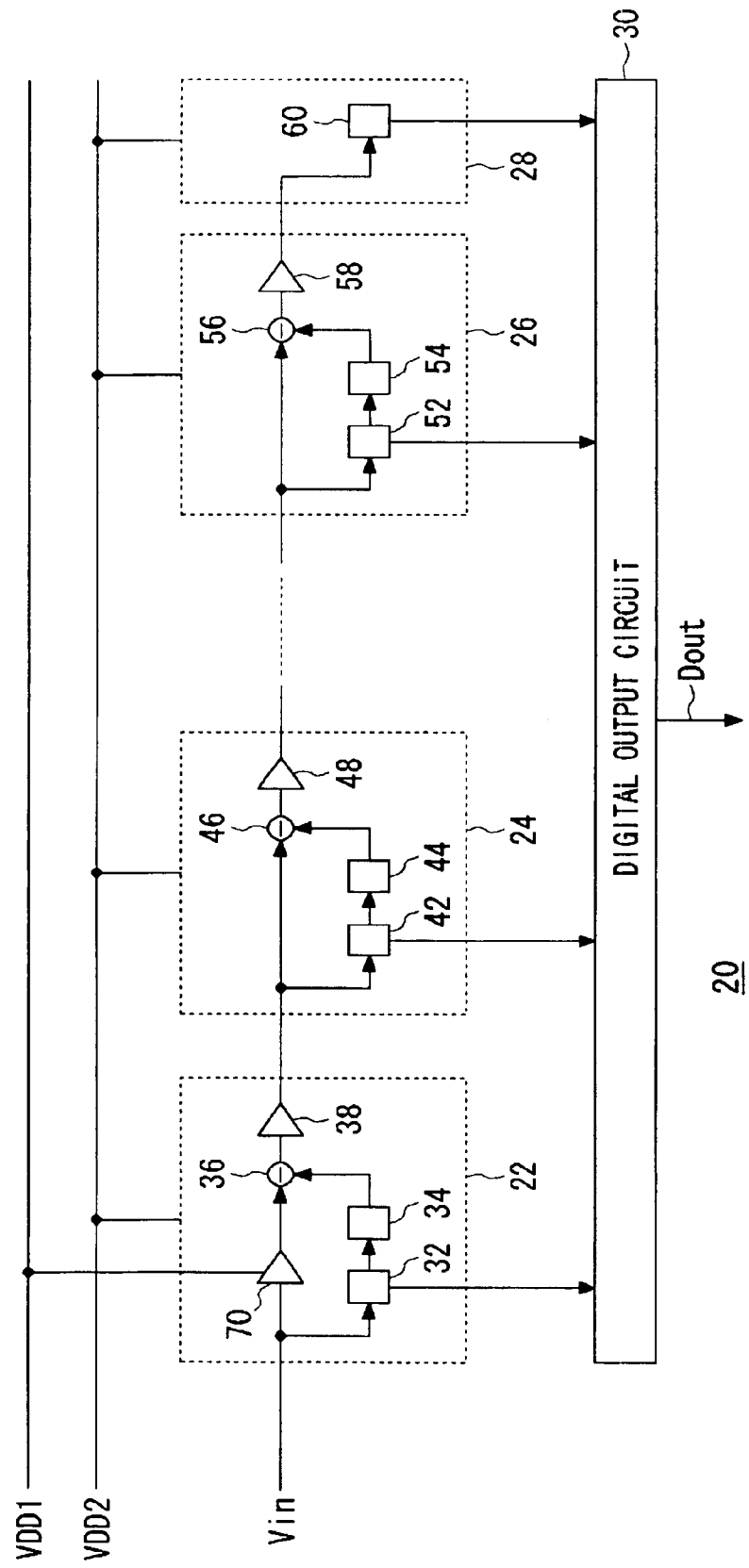
FIG. 5 is a diagram showing the configuration of an AD converter according to a fourth embodiment.

FIG. 5 shows the configuration of an AD converter 20 according to a fourth embodiment. The AD converter 20 according to this embodiment is different from that of the other embodiments in that the second voltage source VDD2 supplies a voltage to all the multiple stages of conversion units but the first voltage source VDD1 supplies a voltage only to some of the circuits of the first conversion unit 22. Now, the different point will be mainly described below.

The first conversion unit 22 further includes a sample and hold circuit 70 in addition to the first A-D conversion circuit 32, the first DA conversion circuit 34, the first subtraction circuit 36, and the first amplification circuit 38. The sample and hold circuit 70 holds an input analog signal Vin until the first subtraction circuit 36 performs a subtraction at least on the output from the first DA conversion circuit 34.

In this embodiment, the sample and hold circuit 70 included in the first stage or the first conversion unit 22 needs the highest analog accuracy, and is thus supplied with a voltage of 2.7V by the first voltage source VDD1. The other circuits included in the first conversion unit 22 needs less analog accuracy than the sample and hold circuit 70, and is thus supplied with a voltage of 1.2V by the second voltage source VDD2. This serves to reduce the overall power consumption when compared with a conventional case in which a voltage of about 2.7V is supplied to all the stages.

(Fifth Embodiment)

Figure 6:
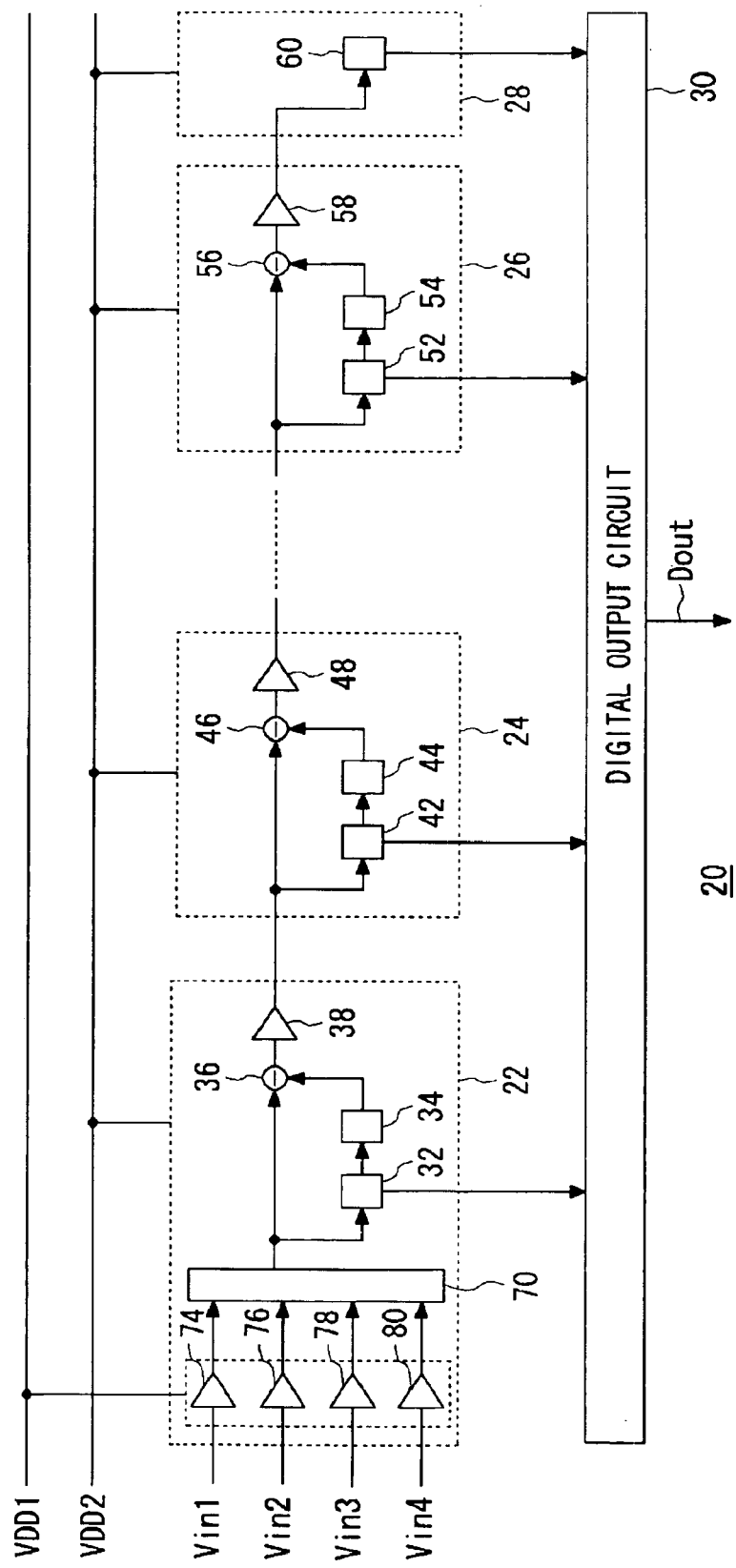
FIG. 6 is a diagram showing the configuration of an AD converter according to a fifth embodiment.

FIG. 6 shows the configuration of an AD converter 20 according to a fifth embodiment. The AD converter 20 according to this embodiment is different from that of the fourth embodiment in that the second voltage source VDD2 supplies a voltage to all the multiple stages of conversion units, but is similar thereto in that the first voltage source VDD1 supplies a voltage only to some of the circuits of the first conversion unit 22. However, the first conversion unit 22 of this embodiment is different in configuration from the first conversion unit 22 according to the fourth embodiment. Now, the different point will be mainly described below.

The first conversion unit 22 further includes an analog switch 72, a first sample and hold circuit 74, a second sample and hold circuit 76, a third sample and hold circuit 78, and a fourth sample and hold circuit 80 in addition to the first AD conversion circuit 32, the first DA conversion circuit 34, the first subtraction circuit 36, and the first amplification circuit 38. The first sample and hold circuit 74 holds a first input analog signal Vin1. Likewise, the second sample and hold circuit 76 holds a second input analog signal Vin2, the third sample and hold circuit 78 holds a third input analog signal Vin3, and the fourth sample and hold circuit 80 holds a fourth input analog signal Vin4.

The analog switch 72 selectively delivers the respective outputs from the first sample and hold circuit 74, the second sample and hold circuit 76, the third sample and hold circuit 78, and the fourth sample and hold circuit 80 in that order to the first AD conversion circuit 32 and the first subtraction circuit 36. That is, the circuits downstream of the analog switch 72 sequentially AD convert the first input analog signal Vin1, the second input analog signal Vin2, the third input analog signal Vin3, and the fourth input analog signal Vin4.

The first sample and hold circuit 74, the second sample and hold circuit 76, the third sample and hold circuit 78, and the fourth sample and hold circuit 80 operate on a 2 MHz clock. In contrast to this, the other components of the first conversion unit 22 such as the analog switch 72, the first AD conversion circuit 32, the first DA conversion circuit 34, the first subtraction circuit 36, and the first amplification circuit 38, and the other components other than the first conversion unit 22 such as the second conversion portion 24, the conversion portion 26, and the nth conversion portion 28 operate on a 8 MHz clock. That is, the components downstream of the analog switch 72 operate four times faster than each of the sample and hold circuits. Accordingly, as a whole, four analog values can be converted to digital values on each clock of the sample and hold circuits.

In this embodiment, the first sample and hold circuit 74, the second sample and hold circuit 76, the third sample and hold circuit 78, and the fourth sample and hold circuit 80, which are included in the first stage or the first conversion unit 22, need the highest analog accuracy, and are thus supplied with a voltage of 2.7V by the first voltage source VDD1. The other circuits included in the first conversion unit 22 and the circuits downstream of the second conversion portion 24 need less analog accuracy than the first sample and hold circuit 74, the second sample and hold circuit 76, the third sample and hold circuit 78, and the fourth sample and hold circuit 80, and are thus supplied with a voltage of 1.8V by the second voltage source VDD2. This serves to reduce the overall power consumption when compared with a conventional case in which a voltage of about 2.7V is supplied to all the stages.

Up to this point, the present invention has been described in conjunction with the embodiments. These embodiments are given solely by way of illustration. It will be understood by those skilled in the art that various modified examples may be made of combinations of the foregoing components and processes, and all such modified examples are also intended to fall within the scope of the present invention. The following provides some of the modified examples.

In each of the embodiments, the first voltage source VDD1 and the second voltage source VDD2 each supply the voltage having the same value to each conversion unit of each stage in the first conversion unit 22 to the nth conversion unit 28. In a modified example, voltages having different values may also be supplied to components such as the amplifiers or switches included in the conversion unit of each stage. For example, a higher voltage of 2.7V may be supplied only to a single component included in the first stage or the first conversion unit 22 while a lower voltage of 1.2V may be supplied to the other components and the second and subsequent stages or the second conversion unit 24 to the nth conversion unit 28.

In the third embodiment, a stepped-up voltage is provided only to the first stage or the first conversion unit 22. In a modified example, a plurality of step-up units may be provided such that each unit supplies a voltage having a different value to the conversion unit in the respective stages. Alternatively, a stepped-up voltage may be supplied only to a conversion unit that requires a higher supply voltage or to a circuit unit in the conversion unit. This makes it possible to supply gradually reduced voltages to the first and subsequent stages, thereby reducing the overall voltage.

In each of the embodiments, an AD converter which includes conversion units in four stages or more is shown as one example. In a modified example, an AD converter which includes conversion units in two stages or three stages may be used.

The second embodiment has been illustrated which has four voltage sources for supplying voltages having four values. In a modified example, a plurality of voltage sources for supplying voltages having three values or five or more values may be used. Furthermore, as another modified example, voltages having a plurality of values by dividing a single voltage source with load resistors may be supplied.

What is claimed is:

1. An analog-to-digital conversion circuit, comprising:

a group of conversion units including at least two stages of conversion units each of which produces a digital value of several bits in stages according to an input analog voltage; and a plurality of power sources which supply voltages to the group of conversion units, wherein in the group of conversion units, a first stage converts a predetermined number of bits from the most significant bit, and second and subsequent stages convert lower-order bits than the predetermined number of bits, and the plurality of power sources supply voltages to the conversion units in the second and subsequent stages, the voltages being lower than the voltage supplied to the conversion unit in the first stage.

2. An analog-to-digital conversion circuit, comprising:

a group of conversion units including at least two stages of conversion units each of which produces a digital value of several bits in stages according to an input analog voltage; and a power source which supplies a voltage to the group of conversion units, wherein in the group of conversion units, a first stage converts a predetermined number of bits from the most significant bit, and second and subsequent stages convert lower-order bits than the predetermined number of bits, and in the group of conversion units, a voltage supplied to a stage by the power source is lower than that supplied to its preceding stage.

3. An analog-to-digital conversion circuit, comprising:

a group of conversion units including at least two stages of conversion units each of which produces a digital value of several bits in stages according to an input analog voltage;

a power source which supplies a voltage to the group of conversion units; and a voltage step-up unit which steps up the voltage, wherein in the group of conversion units, a first stage converts a predetermined number of bits from the most significant bit, and second and subsequent stages convert lower-order bits than the predetermined number of bits, and the step-up unit steps up the voltage to be supplied from the power source to at least part of the conversion unit in the first stage into a higher voltage.

4. The analog-to-digital conversion circuit according to claim 1, wherein in the group of conversion units, a conversion unit to which the power source supplies a lower voltage is designed to have a lower voltage range for an analog signal.

5. The analog-to-digital conversion circuit according to claim 2, wherein in the group of conversion units, a conversion unit to which the power source supplies a lower voltage is designed to have a lower voltage range for an analog signal.

6. The analog-to-digital conversion circuit according to claim 3, wherein in the group of conversion units, a conversion unit to which the power source supplies a lower voltage is designed to have a lower voltage range for an analog signal.

7. An image processing circuit comprising:

an image sensor which receives light from a subject to convert the light into an electric signal;

an auto gain control which amplifies the electric signal received from the image sensor;

an analog-to-digital converter including at least two stages of conversion units, each of which produces a digital value of several bits in stages according to an amplified analog signal, a first stage converting a predetermined number of bits from the most significant bit, second and subsequent stages converting lower-order bits than the predetermined number of bits;

a digital signal processor which performs image processing on a converted digital signal;

a first voltage source which supplies a relatively high voltage; and a second voltage source which supplies a relatively low voltage, wherein the first voltage source supplies a voltage to the auto gain control, the second voltage source supplies a voltage to the digital signal processor, the first voltage source and the second voltage source supply voltages to the analog-to-digital converter, and the first voltage source supplies a voltage to the first stage of a conversion unit while the second voltage source supplies a voltage to the second and subsequent stages of conversion units.

8. An image processing circuit comprising:

an image sensor which receives light from a subject to convert the light into an electric signal;

an auto gain control which amplifies the electric signal received from the image sensor;

an analog-to-digital converter including at least two stages of conversion units, each of which produces a digital value of several bits in stages according to an amplified analog signal, a first stage converting a predetermined number of bits from the most significant bit, second and subsequent stages converting lower-order bits than the predetermined number of bits;

a digital signal processor which performs image processing on a converted digital signal, a first voltage source which supplies a relatively high voltage, and a second voltage source which supplies a relatively low voltage, wherein the first voltage source supplies a voltage to the auto gain control, the second voltage source supplies a voltage to the digital signal processor, the first voltage source and the second voltage source supply voltages to the analog-to-digital converter, and in the at least two stages of conversion units, a voltage supplied to a stage is lower than that supplied to its preceding stage.

9. An image processing circuit comprising:

an image sensor which receives light from a subject to convert the light into an electric signal;

an auto gain control which amplifies the electric signal received from the image sensor;

an analog-to-digital converter including at least two stages of conversion units, each of which produces a digital value of several bits in stages according to an amplified analog signal, a first stage converting a predetermined number of bits from the most significant bit, second and subsequent stages converting lower-order bits than the predetermined number of bits;

a digital signal processor which perform image processing a converted digital signal;

a first voltage source which supplies a relatively high voltage;

a second voltage source which supplies a relatively low voltage; and a step-up unit which steps up the voltage, wherein the first voltage source supplies a voltage to the auto gain control, the second voltage source supplies a voltage to the digital signal processor, at least one of the first voltage source and the second voltage source supplies a voltage to the analog-to-digital converter, and the step-up unit steps up the voltage to be supplied from the voltage source to at least part of the conversion unit in the first stage.

10. The image processing circuit according to claim 7, wherein in the at least two stages of conversion units, a conversion unit to which the voltage source supplies a lower voltage is provided with a lower voltage range for an analog signal.

11. The image processing circuit according to claim 8, wherein in the at least two stages of conversion units, a conversion unit to which the voltage source supplies a lower voltage is provided with a lower voltage range for an analog signal.

12. The image processing circuit according to claim 9, wherein in the at least two stages of conversion units, a conversion unit to which the voltage source supplies a lower voltage is provided with a lower voltage range for an analog signal.

13. An analog-to-digital conversion circuit comprising:

a group of conversion units including at least two stages of conversion units each for producing a digital value of several bits in stages in accordance with an input analog voltage; and a plurality of power sources for supplying voltages to the group of conversion units, wherein in the group of conversion units, the first stage converts a predetermined number of bits from the most significant bit, and the second and subsequent stages convert lower-order bits than the predetermined number of bits, and the plurality of power sources supply a voltage to part of the conversion unit in the first stage, the voltage being higher than a voltage supplied to the conversion units in the second and subsequent stages.

14. The analog-to-digital conversion circuit according to claim 13, wherein the conversion unit in the first stage includes an AD conversion circuit, a DA conversion circuit, a subtraction circuit, an amplification circuit, and a sample and hold circuit, and the plurality of power sources supply a voltage only to the sample and hold circuit included in the conversion unit in the first stage, the voltage being higher than a voltage supplied to the conversion units in the second and subsequent stages.

15. The analog-to-digital conversion circuit according to claim 14, wherein the conversion unit in the first stage includes a plurality of sample and hold circuits, and the plurality of power sources supply a voltage only to the plurality of sample and hold circuits included in the conversion unit in the first stage, the voltage being higher than a voltage supplied to the conversion units in the second and subsequent stages.

16. The analog-to-digital conversion circuit according to claim 13, wherein in the group of conversion units, a circuit to which the power source supplies a lower voltage is designed to have a narrower voltage range for an analog signal.

17. The analog-to-digital conversion circuit according to claim 14, wherein in the group of conversion units, a circuit to which the power source supplies a lower voltage is designed to have a narrower voltage range for an analog signal.

18. The analog-to-digital conversion circuit according to claim 15, wherein in the group of conversion units, a circuit to which the power source supplies a lower voltage is designed to have a narrower voltage range for an analog signal.

* * * * *